(12) United States Patent
McCullough et al.

(10) Patent No.: US 6,967,713 B2
(45) Date of Patent: *Nov. 22, 2005

(54) USE OF MULTIPLE RETICLES IN LITHOGRAPHIC PRINTING TOOLS

(75) Inventors: Andrew W. McCullough, Newtown, CT (US); Christopher Mason, Newtown, CT (US); Louis Markoya, Sandy Hook, CT (US); Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/939,328

(22) Filed: Sep. 14, 2004

(65) Prior Publication Data

US 2005/0030514 A1 Feb. 10, 2005

Related U.S. Application Data

(63) Continuation of application No. 10/654,406, filed on Sep. 4, 2003, now Pat. No. 6,800,408, which is a continuation of application No. 09/785,777, filed on Feb. 16, 2001, now Pat. No. 6,628,372.

(51) Int. Cl.$^7$ ..................... G03B 27/62; G03B 27/42; G03C 5/00
(52) U.S. Cl. ............................ 355/75; 355/53; 430/30
(58) Field of Search ...................... 355/53, 75; 430/22, 430/30, 312

(56) References Cited

U.S. PATENT DOCUMENTS

| | | | |
|---|---|---|---|
| 5,281,996 A | 1/1994 | Bruning et al. | |
| 5,502,313 A | 3/1996 | Nakamura et al. | |
| 5,973,766 A | 10/1999 | Matsuura et al. | |
| 5,995,200 A | 11/1999 | Pierrat | |
| 6,278,514 B1 | 8/2001 | Ohsaki | |
| 6,341,007 B1 | 1/2002 | Nishi et al. | |
| 6,628,372 B2 | 9/2003 | McCullough et al. | |
| 6,800,408 B2 * | 10/2004 | McCullough et al. | ......... 430/30 |

FOREIGN PATENT DOCUMENTS

| | | |
|---|---|---|
| EP | 0 855 623 A2 | 7/1998 |
| EP | 0 855 623 A3 | 7/1998 |

OTHER PUBLICATIONS

European Search Report from European Patent Appl. No. 02003451.8, dated Mar. 8, 2005, 3 pages.

* cited by examiner

Primary Examiner—Alan Mathews
(74) Attorney, Agent, or Firm—Sterne, Kessler, Goldstein & Fox P.L.L.C.

(57) ABSTRACT

A reticle stage having a range of motion sufficient to scan at least two distinct reticles. In a photolithographic process, a reticle stage having an extended range of motion and containing at least two reticles, preferably a phase shift reticle and a trim reticle, is used. The reticle stage scans the two reticles across an illumination field. The image of each reticle is projected by projection optics onto a photosensitive substrate on a wafer stage. The field on the photosensitive substrate is exposed with the image of the first reticle and subsequently exposed with the image of the second reticle. The projection of an image of a first and second reticle onto the same field in a scanning operation greatly facilitates throughput of the photolithographic tool or device. Reticle changes are eliminated when at least two reticles are needed to expose a single field. The use of multiple reticles to expose a single field is necessary when a phase shift mask and related trim mask are used. In another embodiment, the reticle stage has a range of motion permitting scanning of an additional calibration reticle. This permits rapid real time system calibration.

12 Claims, 3 Drawing Sheets

USE OF MULTIPLE RETICLES IN LITHOGRAPHIC PRINTING TOOLS

CROSS-REFERENCE TO RELATED APPLICATIONS

This application is a continuation of U.S. Ser. No. 10/654,406, filed Sep. 4, 2003 (now U.S. Pat. No. 6,800,408), which is a continuation of U.S. Ser. No. 09/785,777 (now U.S. Pat. No. 6,628,372 that issued Sep. 30, 2003), filed Feb. 16, 2001, which are both incorporated by reference herein in their entireties.

FIELD OF THE INVENTION

The present invention relates in general to photolithography used in the manufacture of semiconductor devices, and particularly to a reticle stage and method of increasing throughput.

BACKGROUND OF THE INVENTION

In the manufacture of semiconductor or electronic devices, photolithographic techniques or processes are often used. In the photolithographic or lithographic process, a circuit pattern contained on a mask or a reticle is projected or imaged onto a photosensitive substrate.

The now patterned after processing photosensitive substrate is further processed to form a semiconductor or other electronic device by well known techniques. The substrate is typically a wafer. As the feature sizes required to be printed become smaller, different techniques for imaging the features become necessary. One technique for providing an improved quality of printing of the pattern is the use of a phase shift mask or reticle. The use of a phase shift mask or reticle generally requires the exposure of the same field or area on a photosensitive substrate or wafer first with a phase shift mask and second with a trim mask. The trim mask is physically distinct from the phase shift mask and may be printed with separate exposure conditions.

Accordingly, where the photolitographic process requires exposure of the same field on a photosensitive substrate with different masks, the masks must be changed between each exposure. This change greatly reduces throughput and often creates potential alignment problems. A time consuming and potentially error prone alignment process must be done for each mask used to expose the field on the photosensitive substrate or wafer. Accordingly, there is a need for a reticle stage and method for exposing the same field with at least two different masks or reticles in a manner to increase throughput and prevent alignment or calibration problems. There will always be a decrease in throughput as the wafer is essentially exposed twice. There is a need to eliminate this loss in throughput to close to the unavoidable two exposure loss.

SUMMARY OF THE INVENTION

The present invention is directed to a reticle stage and method for increasing throughput, and improving alignment when multiple masks or reticles are used during a double exposure of a field on a photosensitive substrate. A reticle stage is used in a scanning photolithographic tool or device comprising at least two masks or reticles. This invention can also be applied to a step and repeat system. The reticle stage has a range of motion permitting at least two masks or reticles to be scanned sequentially exposing the same field to two different patterns on a photosensitive substrate. In another embodiment, the reticle stage may have a third calibration reticle placed adjacent to one of at least two masks or reticles. At least one photosensitive substrate or wafer plane detector is used in combination with the calibration reticle or mask providing real time system calibration. The present invention is particularly suited for use with phase shift masks or reticles and associated trim masks or reticles.

Accordingly, it is an object of the present invention to provide increased throughput when the system is used in a double exposure mode.

It is another object of the present invention to improve alignment between exposures of the same field with at least two masks or reticles.

It is an advantage of the present invention that manufacturing costs are reduced.

It is a further advantage of the present invention that the same field can be exposed with at least two masks or reticles without requiring a mask or reticle change and realignment.

It is a feature of the present invention that a mask or reticle stage is used with at least two reticles or masks that has a range of motion permitting scanning of at least two masks or reticles.

It is another feature of the present invention that a calibration reticle or mask is used in combination with at least one substrate or wafer plane detector.

These and other objects, advantages, and features will become readily apparent in view of the following more detailed description.

IN THE DRAWINGS

DETAILED DESCRIPTION OF THE PREFERRED EMBODIMENTS

Figure 1A:
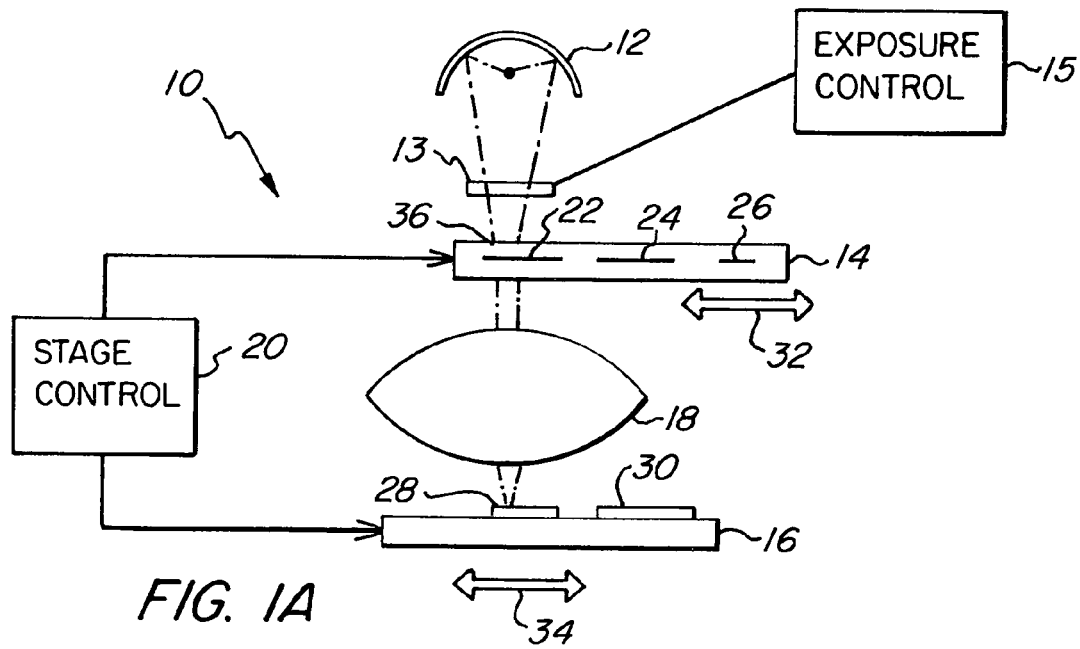
FIG. 1A illustrates schematically a lithographic tool using multiple reticles or masks in a first position.
Figure 1B:
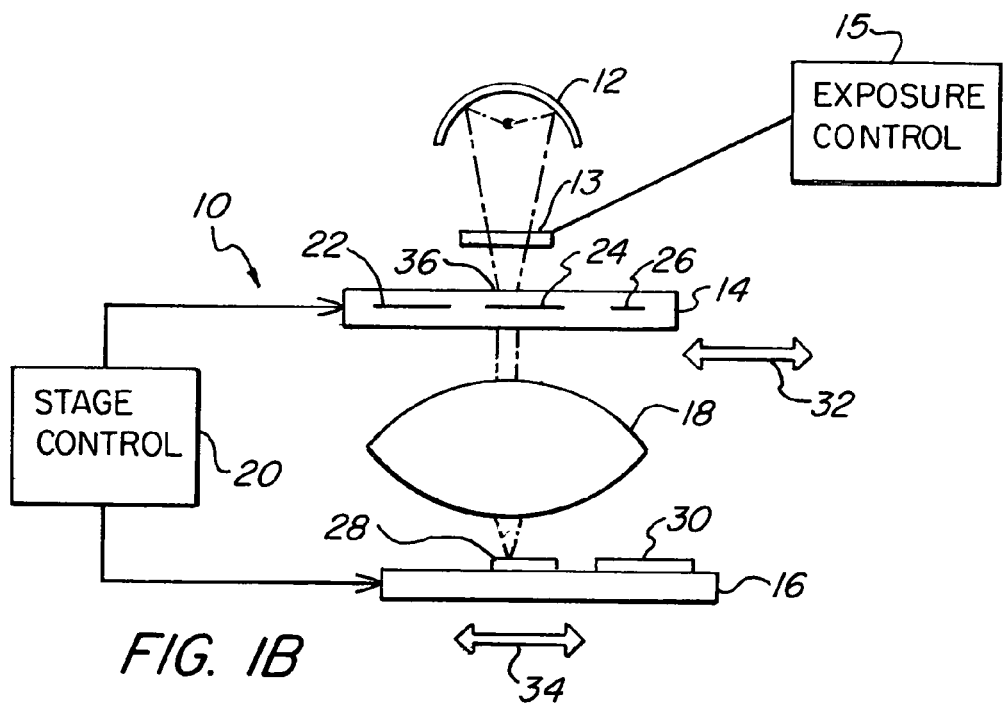
FIG. 1B illustrates schematically a lithographic tool using multiple reticles or masks in a second position.

FIGS. 1A and 1B schematically illustrates the present invention. FIG. 1A illustrates the present invention in a first position, and FIG. 1B illustrates the present invention in a second position.

FIG. 1A illustrates a photolithographic system 10 used to project the image of a mask or reticle 22 onto a photosensitive substrate 28. The terms mask and reticle are intended to be equivalent, and meant to mean a substrate, preferably glass or quartz, bearing a pattern, preferably an integrated circuit, to be reproduced. An illumination system 12 illuminates a mask or reticle 22 held within a mask or reticle stage 14. Associated with the illumination system 12 is an exposure parameter modifier 13 and an exposure control 15. The exposure parameter modifier 13 is used to modify the exposure if needed. For example, the exposure dose or partial coherence may be modified between exposures as needed or desired depending upon the required exposure needed to reproduce the pattern on the mask or reticle 22. This may be accomplished by an adjustable aperture or slit to adjust exposure dose or an array optical element to adjust partial coherence. Projection optics 18 project the image of the reticle 22 onto a photosensitive substrate 28. Photosensitive substrate 28 is held on a wafer or substrate stage 16. The photosensitive substrate 28 may be a resist coated wafer. The mask or reticle stage 14 and the wafer or substrate stage 16 are controlled by stage control 20. The mask or reticle stage 14 scans in the direction of arrow 32 and the substrate or wafer stage 16 scans in the direction of arrow 34. The mask or reticle stage 14 contains at least two masks or reticles 22 and 24. In this embodiment, the reticle stage 14 also contains a calibration mask or reticle 26. The calibration mask or reticle 26 may be smaller than the mask or reticles 22 and 24, for example, typically one-half the width in the scan direction, or in the direction of arrows 32 and 34. For example, the masks or reticles 22 and 24 may each have a width in the scan direction of approximately fifteen centimeters or six inches, while the calibration mask or reticle 26 has a width in the scan direction of approximately eight centimeters or three inches. The reticle stage 14 may be moved and has a range of motion that is at least equal to the width in the scanned direction of the masks or reticles 22 and 24. Additionally, the stage may have a range of motion to accommodate the calibration reticle 26, as well as any other additional range of scanning motion to accommodate any engineering overscan allowances and the separation between masks or reticles 22, 24, and 26. One or more wafer or substrate plane detector or detectors 30 may be placed on the wafer or substrate stage 16. The wafer or substrate plane detector 30 detects specific patterns on the calibration mask or reticle 26. This permits rapid real time system calibration. The wafer or substrate plane detector or detectors 30 should be positioned such that it will receive the image of the patterns on the calibration mask or reticle 26 during scanning of both the first mask or reticle 22 and the second mask or reticle 24. Additionally, a separate calibration alignment system may be used in conjunction with the calibration mask or reticle 26 and the matched wafer or substrate plane detector or detectors 30.

FIG. 1B is similar to FIG. 1A, but illustrates the reticle stage 14 in a second position for projecting the image of the mask or reticle 24 onto a previously exposed field on the photosensitive substrate 28. The exposed field on the photosensitive substrate 28 being previously exposed by an image of the mask or reticle 22, as illustrated in FIG. 1A.

The invention is particularly adapted to, and intended to be used with, phase shift masks or reticles. For example, the first mask or reticle 22 may be a phase shift mask or reticle, and the second mask or reticle 24 may be a trim mask or reticle adapted to be used in combination with the phase shift mask or reticle. A phase shift mask or reticle and a trim mask or reticle are well known types of masks or reticles and commonly used in photolithography. The phase shift mask or reticle and the trim mask or reticle are used to improve imaging, and in particular to enhance resolution.

Referring to FIGS. 1A and 1B, in operation the reticle stage 14 has the capability and range to scan all three masks or reticles 22, 24, and 26 across the illumination field 36 created by illumination system 12. Accordingly, the reticle stage 14 is scanned in the direction of arrow 32 across the illumination field 36 created by the illumination system 12. Synchronously, the wafer stage 16 is scanned in the direction of arrow 34 to expose the photosensitive substrate or wafer 28 with the image or pattern on the mask or reticle 22. The stage control 20 controls this synchronization. Preferably, the projection optics 18 provide a reduced image on the photosensitive substrate or wafer 28 of the pattern on the mask or reticle 22. Typically, a reduction ratio of four to one is used. This results in the reticle stage 14 scanning at a rate four times that of the wafer stage 16. After this first or initial exposure of the photosensitive substrate or wafer 28 with the image or pattern contained on the mask or reticle 22, the wafer or substrate stage 16 is repositioned for exposing the same field to the image or pattern on mask or reticle 24. Reticle stage 14 then continues scanning the image of the mask or reticle 24 across the illumination field 26, exposing for a second time the same exposure field on the photosensitive substrate or wafer 28. Accordingly, the large overscan capability of the reticle stage 14, in combination with at least two reticles 22 and 24 contained thereon, enable both reticles to be maintained in position with no reticle change or realignment needed after initial alignment. This greatly increases throughput and eliminates any wasted time in having to change reticles and any required realignment after reticle change or substitution. Additionally, by providing a scanning range of motion to include a calibrated mask or reticle 26, specific patterns may be imaged onto one or more matched wafer or substrate plane detector or detectors 30 to provide rapid real time system calibration. Additionally, any changes in the exposure conditions between the two types of masks, such as exposure, partial coherence, or other can be done during a non exposure portion of the wafer print cycle and thus do not effect the throughput.

Figure 2:
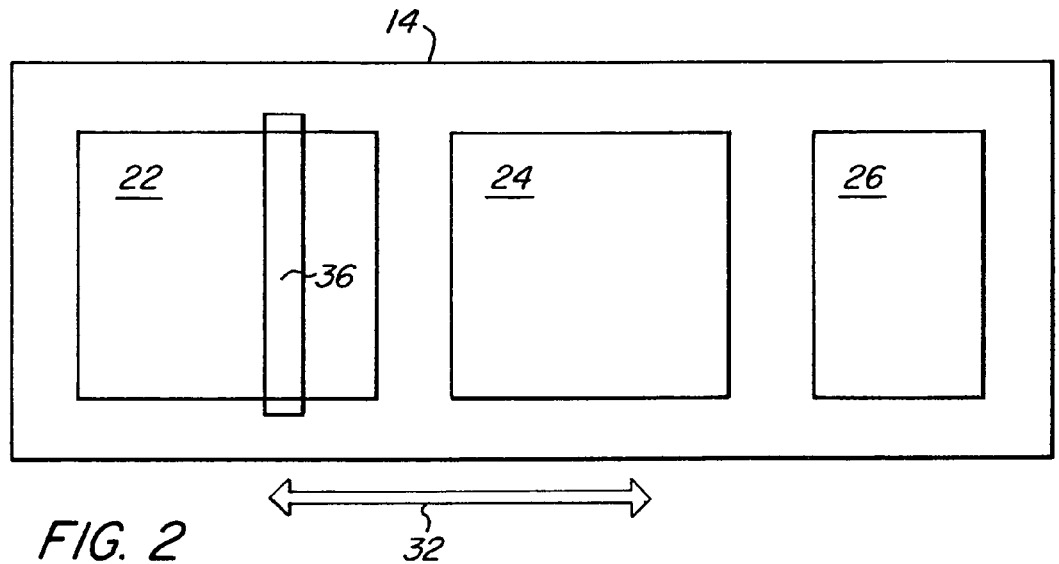
FIG. 2 illustrates schematically a reticle stage having multiple masks or reticles thereon.

FIG. 2 is a plan view schematically illustrating the reticle stage 14. Reticle stage 14 is capable of scanning in the direction of arrow 32 and has a range of motion at least equal to the cumulative width in the scan direction of masks or reticles 22, 24, and 26, plus any engineering overscan allowances that may be required. The range of motion of the reticle stage 14 must also be sufficient to accommodate the space or gap between each of the reticles or masks in the scan direction illustrated by arrow 32. The masks or reticles 22, 24, and 26 may be held within the reticle stage 14 by any conventionally known, or equivalent, reticle holding technique. Accordingly, illumination field 36 generally remains stationary while the reticle stage 14 is scanned in the direction of the arrow 32 so as to sequentially expose the entire surface of all three masks or reticles 22, 24, and 26.

Figure 3:
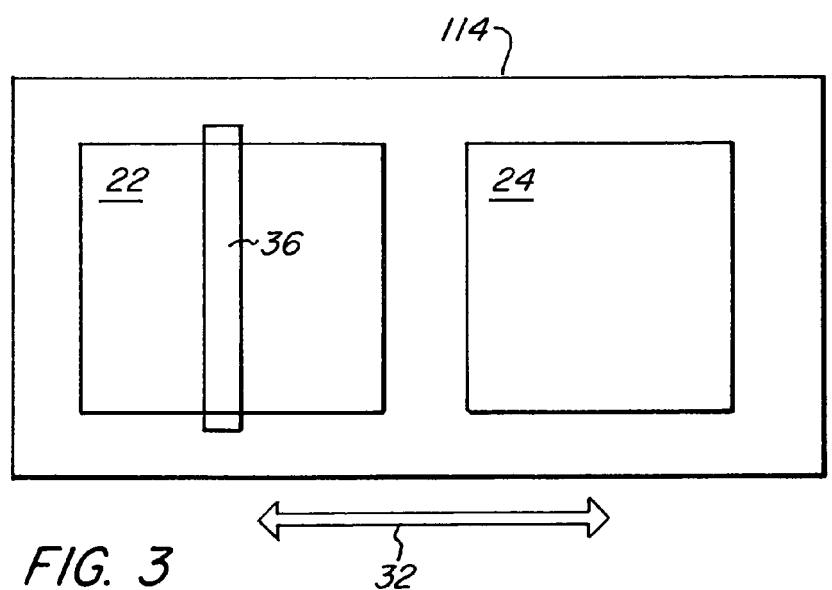
FIG. 3 illustrates schematically another embodiment of the present invention containing two masks or reticles.

FIG. 3 illustrates another embodiment of the present invention. In the embodiment illustrated in FIG. 3, a calibration reticle is not used. FIG. 3 is a plan view schematically illustrating a reticle stage 114. The reticle stage 114 is adapted to hold two related masks or reticles 22 and 24. As previously indicated, reticle 22 may be a phase shift mask or reticle and mask or reticle 24 may be a trim mask or reticle to be used in combination with the phase shift mask or reticle 22. The reticle stage 114 has a range of motion such that the illumination field 36 is scanned in the direction of arrow 32 to illuminate both the masks or reticles 22 and 24.

Figure 4:
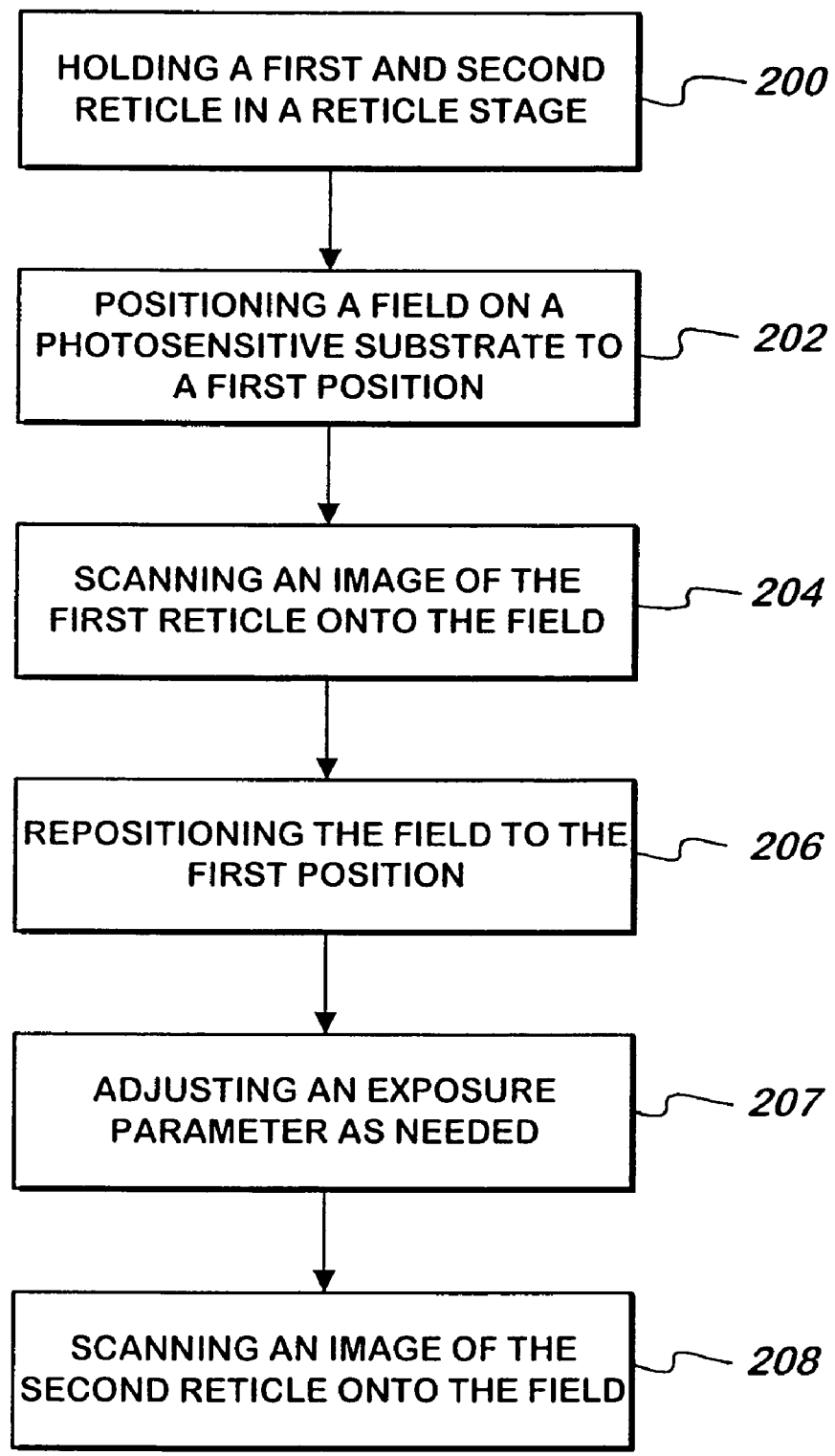
FIG. 4 is a block diagram illustrating the method steps of the present invention.

FIG. 4 is a block diagram illustrating the method or process steps in the present invention. Block 200 represents the step or act of holding a first and second mask in a mask or reticle stage. The mask or reticle stage has a range of motion so that an illumination field can scan both the first and second reticle. Block 202 represents the step or act of positioning a field on a photosensitive substrate to a first or initial position. Block 204 represents the step or act of scanning an image of the first reticle onto the field. The first reticle is preferably a phase shift mask or reticle. Block 206 represents the step or act of repositioning the field that has been exposed by the first reticle to the first position. Block 207 represents the step or act of adjusting an exposure parameter as needed between the exposure of the first reticle and the second reticle. The exposure parameter may be the exposure dose or partial coherence. The partial coherence may be changed by changing the numerical aperture of the illumination system or the angular properties of the illumination. Block 208 represents the step or act of scanning an image of the second reticle onto the field. The second reticle is preferably a trim mask or reticle that is matched or complements the phase shift mask or reticle. The field previously exposed with an image of the first reticle is re-exposed with an image of the second reticle. The use of a phase shift mask and a trim mask adapted to be used with the phase shift mask improves imaging, and particularly resolution.

The present invention greatly facilitates the exposure of at least two reticles in a scanning photolithographic system or tool. The present invention is also particularly adapted for use with a phase shift mask and corresponding trim mask for sequentially exposing the same field on a photosensitive substrate. The time consuming step of changing masks or reticles on a reticle stage is therefore eliminated. Additionally, in one embodiment the use of a calibration reticle or mask and a reticle stage having a range of motion encompassing the calibration reticle or mask makes possible rapid real time system calibration. Therefore, the present invention greatly facilitates and advances the art of electronic device manufacturing. While the present invention has been illustrated and described with respect to several embodiments, in particular an embodiment having a range of motion to accommodate three different reticles, it should be appreciated that other numbers of reticles may be utilized, provided at least two of the reticles are used to expose the same field with a reticle stage having a range of motion sufficient to scan the at least two reticles or masks. Additionally, it will be obvious to those skilled in the art that various modifications may be made without departing from the spirit and scope of this invention.

What is claimed is:

1. A method of calibrating a lithography system, comprising:
   (a) simultaneously coupling a patterning device and a calibration device to a stage;
   (b) projecting an image formed using the patterning device onto a substrate positioned in an exposure field;
   (c) projecting an image formed using the calibration device onto a detector positioned proximate the substrate;
   (d) detecting the image of the calibration device; and
   (e) calibrating the lithography system based on step (d).

2. The method of claim 1, wherein step (e) is performed in real time.

3. The method of claim 1, further comprising:
   (f) adjusting an exposure parameter between subsequent projections of images of the patterning device based on at least one of steps (d) and (e).

4. The method of claim 3, wherein:
the exposure parameter comprises exposure dose.

5. The method of claim 3, wherein:
the exposure parameter comprises partial coherence.

6. The method of claim 1, wherein step (a) comprises:
forming the patterning device through simultaneously coupling a phase shift reticle and a trim reticle to the stage.

7. A lithography system comprising:
a reticle stage;
a means for patterning light that produces a patterned light beam from a received beam of radiation, the means for patterning light being coupled to the reticle stage;
a calibration reticle coupled to the reticle stage proximate the means for patterning light;
projection optics positioned to project images corresponding the patterned light beam and the calibration reticle, respectively, onto a substrate plane;
a substrate stage holding a substrate in the substrate plane and positioned to receive at least one of the images projected from said projection optics;
a detector positioned in the substrate plane, the detector generating signals based on receiving the image of the calibration reticle; and
a controller that performs calibration based on the signals.

8. The system of claim 7, wherein the means for patterning light comprises first and second reticles that are simultaneously coupled to the reticle stage along with the calibration reticle.

9. The system of claim 8, wherein:
the first reticle is a phase shift reticle; and
the second reticle is a trim reticle.

10. The system of claim 9, wherein the image from the phase shift reticle and the image from the trim reticle sequentially expose a single field on the substrate.

11. The system of claim 8, wherein images from the first and second reticles comprise an image of an integrated circuit pattern.

12. The system of claim 8, wherein the controller performs the calibration in real-time.

* * * * *